(12) United States Patent
Yun

(10) Patent No.: US 7,982,814 B2
(45) Date of Patent: Jul. 19, 2011

(54) INVERTER, BACKLIGHT ASSEMBLY AND IMAGE DISPLAY DEVICE HAVING THE SAME

(75) Inventor: Chang Sun Yun, Gumi (KR)

(73) Assignee: LG Innotek Co., Ltd., Seoul (KR)

( * ) Notice: Subject to any disclaimer, the term of this patent is extended or adjusted under 35 U.S.C. 154(b) by 921 days.

(21) Appl. No.: 11/774,467

(22) Filed: Jul. 6, 2007

(65) Prior Publication Data

US 2008/0007979 A1    Jan. 10, 2008

(30) Foreign Application Priority Data

Jul. 7, 2006    (KR) .................. 10-2006-0063946

(51) Int. Cl.
*G02F 1/1333*    (2006.01)

(52) U.S. Cl. ....................................................... 349/58

(58) Field of Classification Search .................. None
See application file for complete search history.

(56) References Cited

U.S. PATENT DOCUMENTS

| | | | | |
|---|---|---|---|---|
| 6,621,670 | B2 * | 9/2003 | Hayakawa et al. | 361/42 |
| 2007/0165151 | A1 * | 7/2007 | Lee et al. | 349/56 |
| 2007/0279545 | A1 * | 12/2007 | Jang | 349/56 |
| 2007/0296903 | A1 * | 12/2007 | Lee et al. | 349/143 |
| 2008/0043193 | A1 * | 2/2008 | Oke et al. | 349/144 |

FOREIGN PATENT DOCUMENTS

KR    10-0704343  B1    3/2007

* cited by examiner

*Primary Examiner* — Sung H Pak

(74) *Attorney, Agent, or Firm* — Saliwanchik, Lloyd & Eisenschenk

(57) ABSTRACT

A DC/AC inverter for a backlight can include a support, a printed circuit board (PCB) on the support, a transformer on the PCB, and a blocking member formed on at least a portion of at least one side of the transformer. The blocking member can be formed of a ferrite material.

20 Claims, 3 Drawing Sheets

INVERTER, BACKLIGHT ASSEMBLY AND IMAGE DISPLAY DEVICE HAVING THE SAME

CROSS-REFERENCE TO RELATED APPLICATION

The present application claims the benefit under 35 U.S.C. §119 of Korean Patent Application No. 10-2006-0063946, filed Jul. 7, 2006, which is hereby incorporated by reference in its entirety.

BACKGROUND

A DC/AC backlight inverter applied to an image display device converts DC voltage into AC voltage. The inverter may also boost the AC voltage to turn on lamps provided in a backlight assembly.

As an image display device becomes larger, the capacity of the inverter is increased and the capacity of a transformer in the inverter is also increased. In addition, in order to save manufacturing costs, a case is typically manufactured using Iron (Fe) or a material containing Fe.

However, as the capacity of the transformer is increased, energy may leak to an exterior due to a line of magnetic force generated from the transformer. Such energy leakage increases even more when the case is manufactured using Fe or a material containing Fe.

BRIEF SUMMARY

Embodiments of the present invention provide an inverter capable of improved efficiency by inhibiting energy from being leaked from a transformer of the inverter to an exterior.

An embodiment provides a backlight assembly capable of improved efficiency by inhibiting energy from leaking from a transformer to an exterior, and an image display device having the same.

According to one embodiment a DC/AC inverter can include: a support; a printed circuit board (PCB) on the support; a transformer on the PCB; and a blocking member on at least a portion of one side of the transformer.

An embodiment provides a backlight assembly comprising: a housing having a lamp therein; a printed circuit board (PCB) under the housing; a transformer under the PCB; a blocking member on at least a portion of one side of the transformer; and a case covering the PCB, the transformer and the blocking member.

An embodiment provides an image display device comprising: a liquid crystal panel; a housing supporting the liquid crystal panel and having a lamp therein; a printed circuit board (PCB) under the housing; a transformer under the PCB; a blocking member on at least a portion of one side of the transformer; and a case covering the PCB, the transformer and the blocking member.

DETAILED DESCRIPTION

Hereinafter, an inverter, backlight assembly, and image display device according to embodiments of the present invention will be described with reference to the accompanying drawings.

Figure 1:
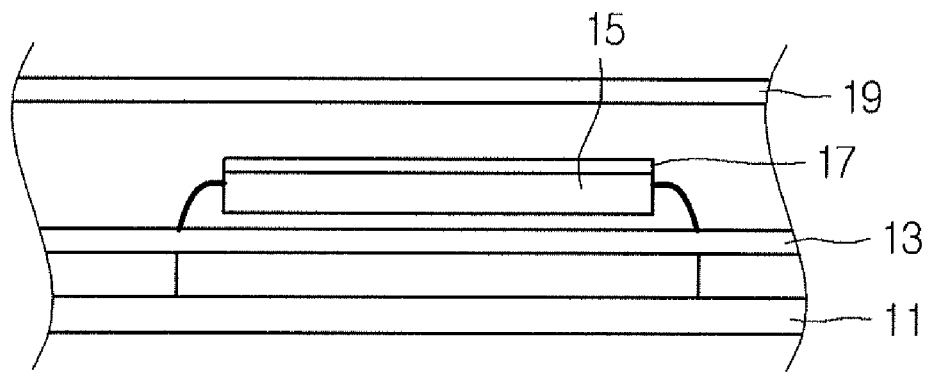
FIG. 1 is a cross-sectional view schematically showing an inverter according to an embodiment.

As shown in FIG. 1, an inverter according to an embodiment includes a support 11, a printed circuit board (PCB) 13, a transformer 15 and a blocking member 17.

The PCB 13 is disposed on the support 11. The PCB 13 can be spaced apart from the support 11 at a predetermined interval. The transformer 15 is disposed on the PCB 13. The transformer 15 can be electrically connected to the PCB 13.

The blocking member 17 can be formed on the transformer 15. The blocking member 17 can include ferrite. For example, the blocking member 17 can be formed of Ni—Zn ferrite or Mn—Zn ferrite.

According to an embodiment, the blocking member 17 is formed on the transformer 15, so that energy can be prevented from being leaked from the transformer 15 to an exterior. In the case of forming the blocking member 17 using ferrite, the blocking member 17 can efficiently prevent energy from being leaked from the transformer 15.

A case 19 can be formed on the blocking member 17. The case 19 can cover the PCB 13, the transformer 15 and the blocking member 17. In one embodiment, the case 19 can be fixedly coupled to the support 11.

The case 19 can include Fe or a material containing Fe. When the case 19 is formed using Fe or a material containing Fe, the manufacturing cost thereof can be reduced compared with forming the case 19 using aluminum.

When the blocking member 17 is not provided on the transformer 15, energy may be leaked to the case 19 due to a line of magnetic force generated by the transformer 15. However, in an embodiment, since the blocking member 17 is formed on the transformer 15, energy can be inhibited from being leaked to the case 19 from the transformer 15. Accordingly, the energy loss can be efficiently reduced and heat generation in the case 19 due to vortex current can also be inhibited.

When the support 11 is formed using Fe or material containing Fe, energy may leak to the support 11 due to a line of magnetic force generated by the transformer 15.

Figure 2:
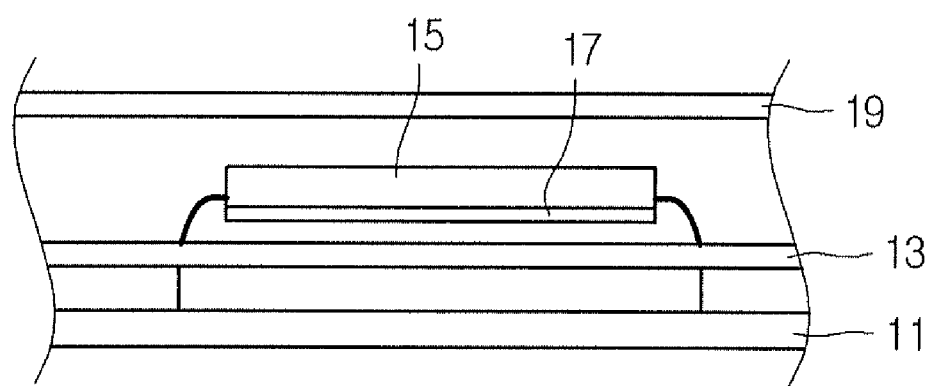
FIGS. 2 and 3 are cross-sectional views schematically showing an inverter according to another embodiment.

In order to inhibit such energy leakage, a blocking member 17 can be formed under the transformer 15 as shown in FIG. 2. The blocking member 17 can be formed between the transformer 15 and the support 11, so that energy can be inhibited from being leaked to the support 11 from the transformer 15. Accordingly, the energy loss can be efficiently reduced and heat generation in the support 11 due to vortex current can also be inhibited.

Accordingly, an inverter as described above can efficiently reduce energy due to a line of magnetic force generated by the transformer 15 from being leaked to the support 11.

According to embodiments, the blocking member 17 can be formed on at least one of the top and bottom surfaces of the transformer 15. In a further embodiment, the blocking member 17 can surround the transformer 15.

Figure 3:
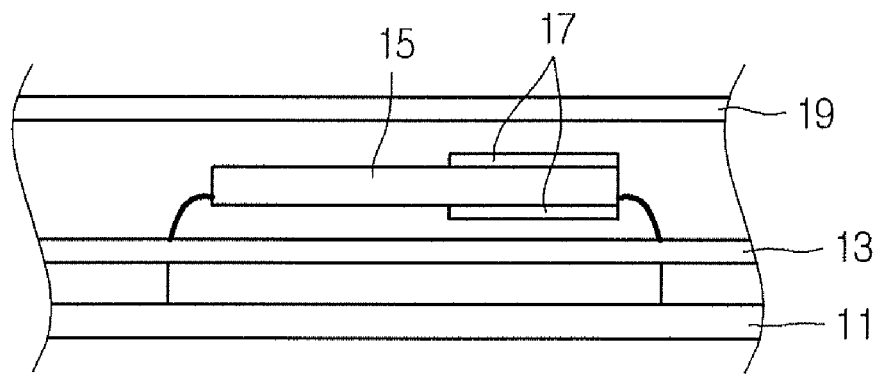

In one embodiment, the blocking member 17 is formed only on a part of the transformer 15. That is, after applying a test power to the transformer 15, a part of the transformer 15 through which inductance is leaked is checked, and the blocking member 17 is selectively formed on the leakage part. For example, as shown in FIG. 3, the blocking member 17 can be partially formed on and/or under the transformer 15.

Figure 4:
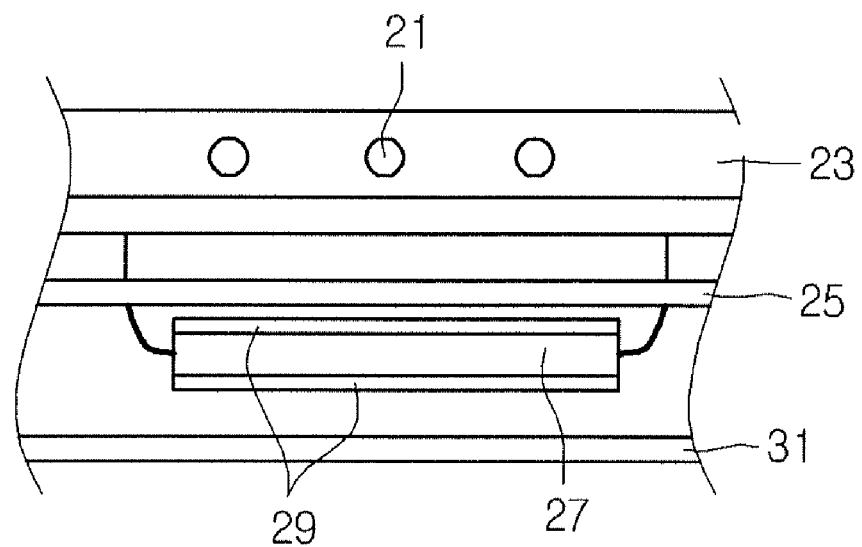
FIG. 4 is a cross-sectional view schematically showing a backlight assembly according to an embodiment.

The inverter as described above can be applied to a backlight assembly. FIG. 4 is a cross-sectional view schematically showing a backlight assembly according to an embodiment.

The backlight assembly can include a housing 23, a PCB 25, a transformer 27, a blocking member 29 and a case 31.

Lamps 21 can be disposed in the housing 23. For example, a lamp 21 can be a Cold Cathode Fluorescent Lamp (CCFL) or an External Electrode Fluorescent Lamp (EEFL).

The PCB 25 is disposed under the housing 23. The PCB 25 can be spaced apart from the housing 23 at a predetermined interval. The transformer 27 is disposed under the PCB 25. The transformer 27 can be electrically connected to the PCB 25.

The blocking member 29 can be formed on and/or under the transformer 27. The blocking member 29 can include ferrite. For example, the blocking member 29 can be formed of Ni—Zn ferrite or Mn—Zn ferrite.

According to an embodiment, the blocking member 29 is formed on and under the transformer 27 so that energy can be inhibited from being leaked from the transformer 27 to an exterior. In the case of forming the blocking member 29 using ferrite, the blocking member 29 can efficiently reduce energy from being leaked from the transformer 27.

A case 31 can be formed under the blocking member 29. The case 31 can cover the PCB 25, the transformer 27 and the blocking member 29. In one embodiment, the case 31 can be fixedly coupled to the housing 23.

The case 31 can include Fe or a material containing Fe. When the case 31 is formed using Fe or a material containing Fe, the manufacturing cost thereof can be reduced compared with forming the case 31 using aluminum.

When the blocking member 29 is not provided under the transformer 27, energy may be leaked to the case 31 due to a line of magnetic force generated by the transformer 27. However, according to an embodiment, the blocking member 29 can be formed under the transformer 27 such that energy can be inhibited from being leaked to the case 31 from the transformer 27. Accordingly, the energy loss can be efficiently reduced and heat generation in the case 31 due to vortex current can also be inhibited.

When the housing 23 is formed using Fe or a material containing Fe, energy may be leaked to the housing 23 due to a line of magnetic force generated by the transformer 27.

According to an embodiment, in order to inhibit such energy leakage, the blocking member 29 can also be formed on the transformer 27. The blocking member 29 is formed between the transformer 27 and the housing 23, so that energy can be inhibited from being leaked to the housing 23 from the transformer 27. Accordingly, the energy loss can be efficiently reduced and heat generation in the housing 23 due to vortex current can also be inhibited.

According to a backlight assembly as described above, energy can be efficiently inhibited from being leaked to the housing 23 or the case 31 due to a line of magnetic force generated by the transformer 27.

Further, according to embodiments, the blocking member 29 can be formed on at least one of the top and bottom surfaces of the transformer 27. In a further embodiment, the blocking member 29 can surround the transformer 27.

In one embodiment, the blocking member 29 can be formed only in a part of the transformer 27. That is, after applying a test power to the transformer 27, a part of the transformer 27 through which inductance is leaked is checked, and the blocking member 29 is selectively formed on the leakage part.

Figure 5:
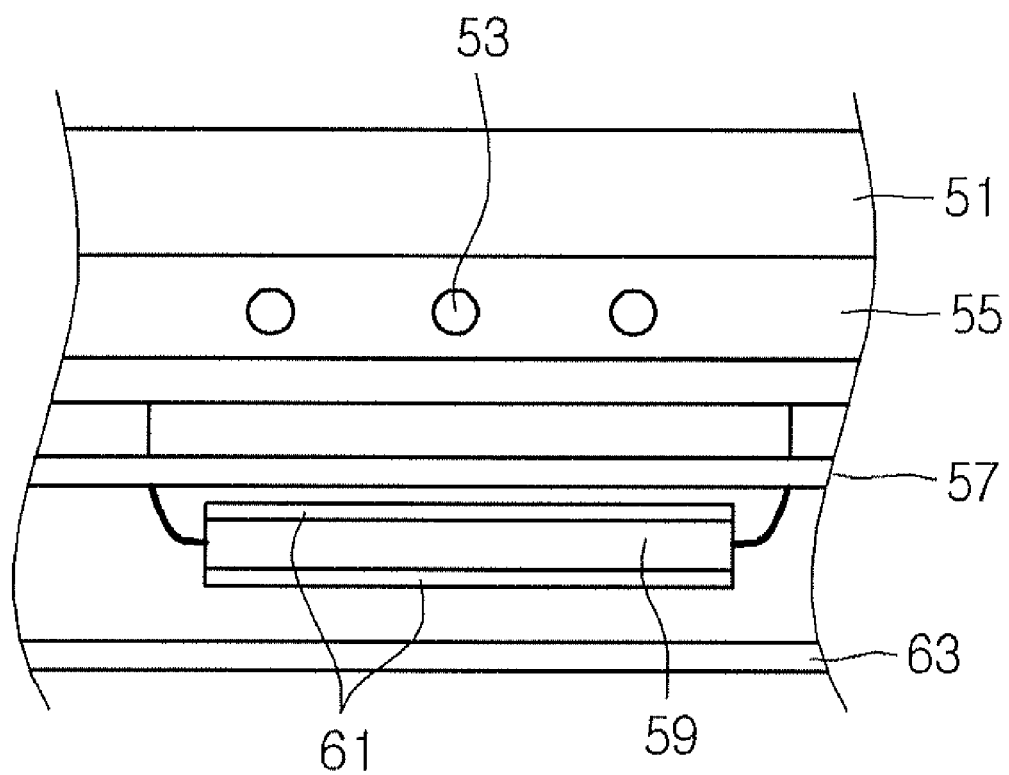
FIG. 5 is a cross-sectional view schematically showing an image display device according to an embodiment.

The backlight assembly as described above can be applied to an image display device. FIG. 5 is a cross-sectional view schematically showing an image display device according to an embodiment.

The image display device according to an embodiment can include a liquid crystal panel 51, a housing 55, a PCB 57, a transformer 59, a blocking member 61 and a case 63.

Lamps 53 can be disposed in the housing 55. For example, a lamp 53 can be a CCFL or an EEFL.

The PCB 57 is disposed under the housing 55. The PCB 57 can be spaced apart from the housing 55 at a predetermined interval. The transformer 59 is disposed under the PCB 57. The transformer 59 can be electrically connected to the PCB 57.

The blocking member 61 may be formed on and/or under the transformer 59. The blocking member 61 can include ferrite. For example, the blocking member 61 can be formed of Ni—Zn ferrite or Mn—Zn ferrite.

According to an embodiment, the blocking member 61 is formed on and under the transformer 59, so that energy can be inhibited from being leaked from the transformer 59 to an exterior. In the case of forming the blocking member 61 using ferrite, the blocking member 61 can efficiently reduce energy from being leaked from the transformer 59.

A case 63 can be formed under the blocking member 61. The case 63 can cover the PCB 57, the transformer 59 and the blocking member 61. In one embodiment, the case 63 can be fixedly coupled to the housing 55.

The case 63 can include Fe or a material containing Fe. When the case 63 is formed using Fe or a material containing Fe, the manufacturing cost thereof can be reduced as compared with forming the case 63 using aluminum.

When the blocking member 61 is not provided under the transformer 59, energy may be leaked to the case 63 due to a line of magnetic force generated by the transformer 59. However, according to an embodiment, the blocking member 61 can be formed under the transformer 59 such that energy can be inhibited from being leaked to the case 63 from the transformer 59. Accordingly, the energy loss can be efficiently reduced and heat generation in the case 63 due to vortex current can also be inhibited.

When the housing 55 is formed using Fe or a material containing Fe, energy may be leaked to the housing 55 due to a line of magnetic force generated by the transformer 59.

According to an embodiment, in order to inhibit such energy leakage, the blocking member 61 can also be formed on the transformer 59. The blocking member 61 is formed between the transformer 59 and the housing 55, so that energy can be inhibited from being leaked to the housing 55 from the transformer 59. Accordingly, the energy loss can be efficiently reduced and heat generation in the housing 55 due to vortex current can also be inhibited.

According to an image display device as described above, energy can be efficiently inhibited from being leaked to the housing 55 or the case 63.

Further, according to embodiments, the blocking member 61 can be formed on at least one of the top and bottom surfaces of the transformer 59. In a further embodiment, the blocking member 61 can surround the transformer 59.

In one embodiment, the blocking member 61 can be formed only on a part of the transformer 59. That is, after applying a test power to the transformer 59, a part of the transformer 59 through which inductance is leaked is checked, and the blocking member 61 is selectively formed on the leakage part.

In the description of an embodiment, when a layer (or film) is referred to as being "on/under" another layer or substrate, it can be directly "on/under" the other layer, or intervening layers may also be present.

In the description about the elements of the embodiment, the position "on/under" is described based on the drawing, and the position "on/under" may change depending on locations of the elements.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An inverter comprising:
   a support;
   a printed circuit board (PCB) on the support;
   a transformer on the PCB; and
   a blocking member on the transformer,
   wherein the blocking member surrounds the transformer.

2. The inverter according to claim 1, wherein the blocking member is disposed on both the top and bottom surfaces of the transformer.

3. The inverter according to claim 1, wherein the blocking member comprises ferrite.

4. The inverter according to claim 3, wherein the blocking member comprises Ni—Zn ferrite or Mn—Zn ferrite.

5. The inverter according to claim 1, wherein the support comprises iron (Fe) or a material containing Fe.

6. The inverter according to claim 1, further comprising a case coupled to the support, wherein the case covers the PCB, the transformer and the blocking member.

7. The inverter according to claim 6, wherein the case comprises iron (Fe) or a material containing Fe.

8. A backlight assembly comprising:
   a housing having at least one lamp therein;
   a printed circuit board (PCB) under the housing;
   a transformer under the PCB;
   a blocking member on the transformer; and
   a case covering the PCB, the transformer and the blocking member,
   wherein the blocking member surrounds the transformer.

9. The backlight assembly according to claim 8, wherein the blocking member is disposed on both the top and bottom surfaces of the transformer.

10. The backlight assembly according to claim 8, wherein the blocking member comprises ferrite.

11. The backlight assembly according to claim 10, wherein the blocking member comprises Ni—Zn ferrite or Mn—Zn ferrite.

12. The backlight assembly according to claim 8, wherein the case comprises iron (Fe) or a material containing Fe.

13. The backlight assembly according to claim 8, wherein the housing comprises iron (Fe) or a material containing Fe.

14. The backlight assembly according to claim 8, wherein the at least one lamp comprises a Cold Cathode Fluorescent Lamp (CCFL) or an External Electrode Fluorescent Lamp (EEFL).

15. An image display device comprising:
   a liquid crystal panel;
   a housing supporting the liquid crystal panel and having at least one lamp therein;
   a printed circuit board (PCB) under the housing;
   a transformer under the PCB;
   a blocking member on the transformer; and
   a case covering the PCB, the transformer and the blocking member,
   wherein the blocking member surrounds the transformer.

16. The image display device according to claim 15, wherein the blocking member is disposed on both the top and bottom surfaces of the transformer.

17. The image display device according to claim 15, wherein the blocking member comprises Ni—Zn ferrite or Mn—Zn ferrite.

18. The image display device according to claim 15, wherein the housing comprises iron (Fe) or a material containing Fe.

19. The inverter according to claim 1, wherein the blocking member is disposed on a portion of both the top and bottom surfaces of the transformer.

20. The backlight assembly according to claim 8, wherein the blocking member is disposed on a portion of both the top and bottom surfaces of the transformer.

* * * * *